United States Patent [19]

Okuyama et al.

[11] Patent Number: 4,652,897
[45] Date of Patent: Mar. 24, 1987

[54] SEMICONDUCTOR MEMORY DEVICE

[75] Inventors: Kousuke Okuyama, Tachikawa; Kazuhiro Komori, Kodaira; Hisao Katto, Hinode, all of Japan

[73] Assignee: Hitachi, Ltd., Tokyo, Japan

[21] Appl. No.: 754,961

[22] Filed: Jul. 15, 1985

[30] Foreign Application Priority Data

Jul. 13, 1984 [JP] Japan ................................. 59-144206

[51] Int. Cl.⁴ ............................................. H01L 29/78
[52] U.S. Cl. ................................... 357/23.5; 365/168
[58] Field of Search ........................ 357/23.5; 365/185

[56] References Cited

U.S. PATENT DOCUMENTS

| | | | |
|---|---|---|---|
| 4,193,080 | 3/1980 | Koike et al. ........................ | 357/23.5 |
| 4,203,158 | 5/1980 | Frohman-Bentchkowsky et al. ......................................... | 357/41 |
| 4,302,766 | 11/1981 | Guterman et al. ................. | 357/23.5 |
| 4,462,090 | 7/1984 | Iizuka .................................. | 365/185 |
| 4,521,448 | 6/1985 | Sasaki ................................. | 357/23.5 |

FOREIGN PATENT DOCUMENTS 53-89685(A) 8/1978 Japan ................................. 357/23.5
2077492(A) 12/1981 United Kingdom .............. 357/23.5

Primary Examiner—Martin H. Edlow
Attorney, Agent, or Firm—Antonelli, Terry & Wands

[57] ABSTRACT

A semiconductor memory device wherein a portion of source region of a field-effect transistor that serves as a memory cell has a low impurity concentration, so that hot carriers generated on the source side are injected into the floating gate. Hot carriers are generated by utilizing a large electric field intensity established by the drop of voltage in the region of low impurity concentration. The voltage difference is so great between the source region and the control gate that hot carriers generated on the source side are efficiently injected into the floating gate.

19 Claims, 13 Drawing Figures

SEMICONDUCTOR MEMORY DEVICE

BACKGROUND OF THE INVENTION

The present invention relates to a semiconductor memory device, and more particularly to an arrangement that can be effectively adapted to a semiconductor integrated circuit device provided with a read-only memory function which is capable of erasing data.

With an EPROM in which field-effect transistors having a floating gate serve as memory cells, it is one of the significant present technical goods to improve the efficiency for writing data and to reduce the time for writing data.

Analysis conducted by the inventors of the present invention reveals that the data are written into the memory cells in a manner as described below.

Namely, the voltage drops in a depletion region between a pinch-off point under the gate electrode and the drain region due to an electric current that flows between the source region and the drain region. Therefore, the electric field intensity becomes a maximum near the drain region giving rise to the generation of hot electrons. Most of the hot electrons flow as a drain current, but some of them are injected as data into the floating gate.

Generally, the writing efficiency varies in proportion to the difference $\Delta V$ between a potential (electric potential) at a position where hot electrons are generated and a control gate voltage.

Therefore, it has been attempted to increase the writing efficiency by selecting the control gate voltage to be, for instance, about 21 volts and the drain voltage to be about 12 volts.

Through experiments and consideration of the results thereof, however, the inventors have found the fact that the writing efficiency could not be sufficiently improved. That is, generating hot electrons in a high-potential region close to the drain region make the voltage differenc $\Delta V$ between the control gate and the region in which hot electrons are generated small.

The principle of EPROM operation has been disclosed, for example, in a journal "NIKKEI ELECTRONICS", Jan. 5, 1981.

SUMMARY OF THE INVENTION

The object of the present invention is to provide an arrangement which helps enhance the writing efficiency of EPROM.

Another object of the present invention is to provide an arrangement which helps enhance the writing efficiency of an EPROM and enhance the channel conductance gm.

A further object of the present invention is to provide an arrangement which helps enhance the writing efficiency of an EPROM and improve electrical reliability thereof.

A still further object of the present invention is to provide an arrangement which helps increase the operation speed of an EPROM or which helps increase both the operation speed and electrical reliability thereof.

The above and other objects as well as novel features of the present invention will become obvious from the description of the specification and the accompanying drawings.

A representative example of the invention disclosed herein are briefly described below.

Namely, a semiconductor region of a low concentration having the same type of conductivity as that of the source region is formed between the source region of a field-effect transistor and a region where the channel will be formed in an EPROM. Resistivity of the semiconductor region is selected to be sufficiently high so that a potential difference develops across both ends of the semiconductor region when the field-effect transistor is in operation, and that an intense electric field is established in the semiconductor region. The intense electric field causes hot carriers (hot electrons, hot holes) to be generated. In this semiconductor region, the electric potential is lower than that of a region close to the drain region, whereby the potential difference can be increased between the semiconductor region and the control gate voltage. Accordingly, hot carriers generated in this region can be injected into the floating gate maintaining a high injection efficiency.

DESCRIPTION OF THE PREFERRED EMBODIMENTS

Figure 1A:
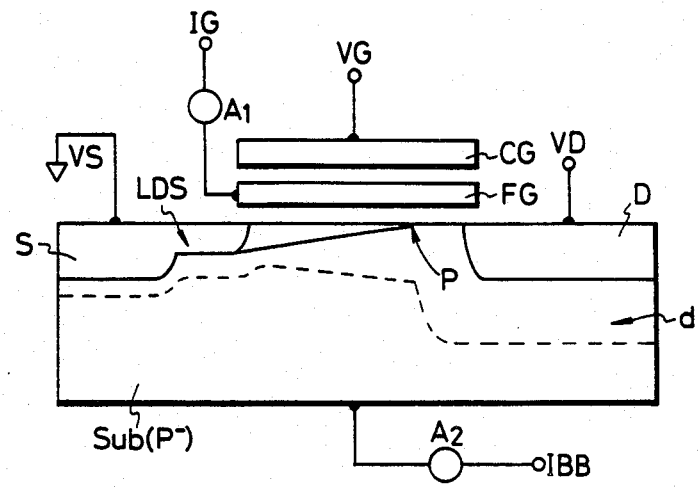
Fig. 1A is a schematic section view of a memory cell in an EPROM for explaining the principle of a first embodiment of the present invention.
Figure 2A:
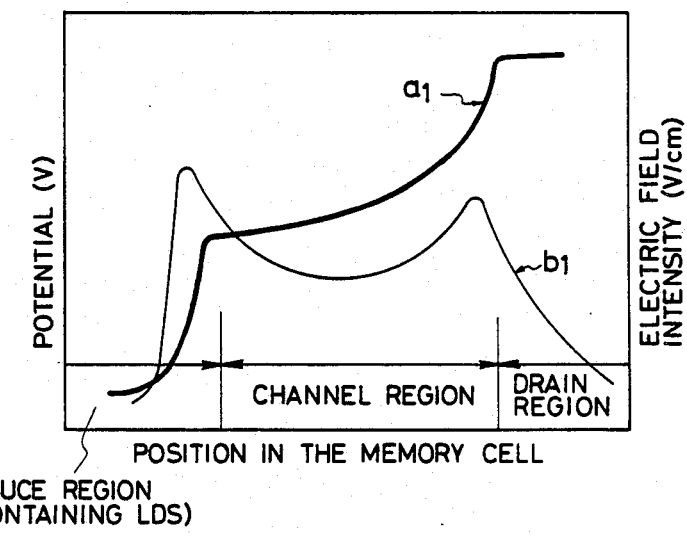
FIG. 2A is a diagram showing a relation between the position and the potential or the electric field intensity in the memory cell of Fig. 1A.
Figure 3A:
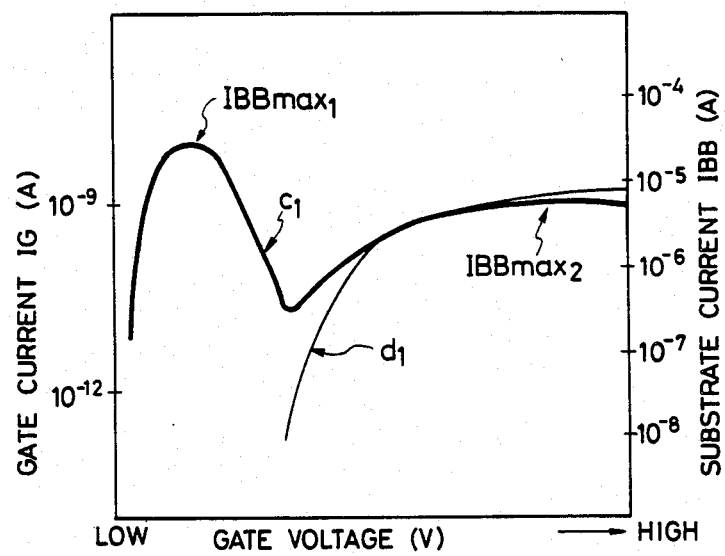
FIG. 3A is a diagram showing a relation between the control gate voltage and the substrate current or the floating gate current in the memory cell of Fig. 1A.

Fig. 1A is a schematic section view of a memory cell in an EPROM for explaining the principle of a first embodiment of the present invention. Fig. 2A is a diagram showing a relation between the position and the potential or the electric field intensity in the memory cell of Fig. 1A, and Fig. 3A is a diagram showing a relation between the control gate voltage and the substrate current or the floating gate current in the memory cell of Fig. 1A, that are confirmed through experiments by the inventors of the present invention.

Figure 1B:
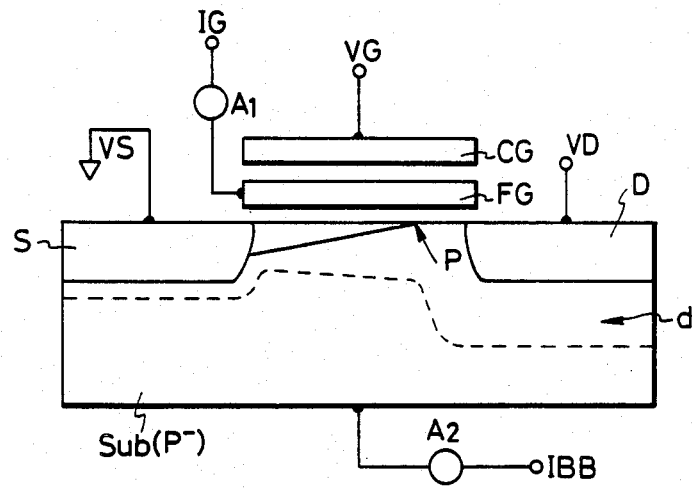
Fig. 1B is a schematic section view of a memory cell for explaining the principle of a conventional EPROM.
Figure 2B:
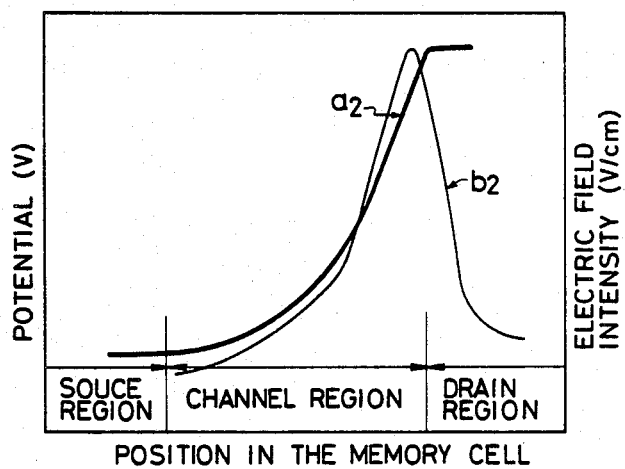
FIG. 2B is a diagram showing a relation between the position and the potential or the electric field intensity in the memory cell of Fig. 1B.
Figure 3B:
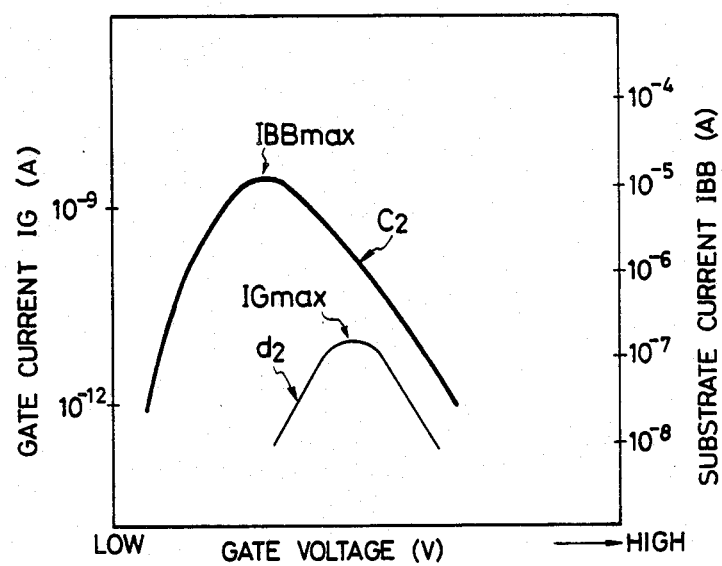
FIG. 3B is a diagram showing a relation between the control gate voltage and the substrate current or the floating gate current in the memory cell of Fig. 1B.

Fig. 1B is a schematic section view of a memory cell for explaining the principle of a conventional EPROM. FIG. 2B is a diagram showing a relation between the position and the potential or the electric field intensity in the memory cell of Fig. 1B, and FIG. 3B is a diagram showing a relation between the control gate voltage and the substrate current or the floating gate current in the memory cell of Fig. 1B.

In the drawings, elements having the same functions are denoted by the same reference numerals or symbols and their explanations are not repeated.

In Figs. 1A and 1B, symbol Sub represents a $p^-$-type semiconductor substrate which is made of single crystalline silicon, and FG denotes a floating gate electrode provided on the semiconductor substrate Sub via an insulating film (not shown).

Symbol CG denotes a control gate electrode which is proivded on the floating gate electrode FG via an insulating film (not shown).

Symbol S denotes a source region and D denotes a drain region, that are provided by the sides of the floating gate electrode FG and the control gate electrode CG.

Symbol LDS (lightly doped source) denotes a semiconductor region which has the same type of conductivity as the source region S, which has a concentration lower than that of the source region S, and which is provided in the main surface of the semiconductor substrate Sub between the source region S and the region where the channel will be formed. Hot electrons are generated in the semiconductor region LDS, and some of them are injected as data into the floating gate electrode FG.

Symbol P denotes a pinch-off point that is generated in the main surface of the semiconductor substrate Sub under the floating gate electrode FG.

Symbol d denotes a depletion region formed in the semiconductor substrate Sub starting from the source region S and the pn junction between the drain region D and the semiconductor substrate Sub.

Symbol VG denotes a voltage-applying terminal which applies to the control gate electrode CG a voltage of, for example, about 21 volts during the writing operation and a voltage of about 5 volts during the reading operation. Symbol VS denotes a voltage-applying terminal which applies ground potential of the circuit, i.e., which applies 0 volt to the source region S, and VD denotes a voltage-applying terminal which applies to the drain region D a voltage of, for example, about 12 volts during the writing operation and which applies a voltage of about 5 volts during the reading operation.

A terminal IG is connected to the floating gate electrode FG via an ammeter $A_1$ that detects a floating gate current IG.

A terminal IBB is connected to the semiconductor substrate Sub via an ammeter $A_2$ that detects a semiconductor substrate current IBB.

In FIGS. 2A and 2B, the abscissa represents the position in the memory cell of Fig. 1A and 1B, respectively, and the ordinate represents the potential [V] and the electric field intensity [V/cm] produced by the current that flows between the source region S and the drain region D with respect to the position in the memory cell.

Solid lines $a_1$, $a_2$ denote potentials at each of the positions of the memory cell, and fine lines $b_l$, $b_2$ denote electric field intensities at each of the positions of the memory cell.

In FIGS. 3A and 3B, the abscissa represents the control gate voltage VG [V], and the ordinate represents a floating gate current IG [A] which is detected by the ammeter $A_l$ and which is produced by hot electrons injected into the floating gate electrode FG, and represents a semiconductor substrate current IBB [A] which is detected by the ammeter $A_2$ and which is produced by hot holes emitted into the semiconductor substrate Sub.

Solid lines $c_l$, $c_2$ denote semiconductor substrate currents $I_{BB}$ [A], and fine lines $d_1$, $d_2$ denote floating gate currents IG[A].

Described below is the operation for writing data onto a memory cell of the EPROM.

First, described below is the writing operation of an EPROM that served as the background art of the present invention, in conjunction with FIGS. 1B, 2B and 3B.

An electric current flowing between the source region S and the drain region D develops a sharp voltage drop in the depletion region d between the drain region D and a pinch-off point P under the floating gate electrode FG, as indicated by the solid line $a_2$. Therefore, the electric field intensity becomes a maximum near the drain region D as indicated by the fine line $b_2$.

Hot holes and hot electrons are chiefly generated in this portion. Hot holes are detected by the ammeter $A_2$ as a semiconductor substrate current IBB. Hot holes and hot electrons are generated each in a pair. By detecting the substrate current IBB, therefore, the amount of hot electrons generated can be approximated.

While most of the hot electrons flow as a drain current, some of them are also injected into the floating gate electrode FG and are detected by the ammeter $A_1$ as a floating gate current IG.

According to the experiments carried out by the inventors, the semiconductor substrate current IBB and the floating gate current IG have maximum values IBBmax and IGmax relative to the control gate voltage VG, the maximum value IBBmax being about $10^{-5}$ 25 [A] and the maximum value IGmax being about $10^{-11}$ [A], as indicated by the solid line $c_2$ and fine line $d_2$.

Writing operation according to the first embodiment of the present invention will be described below in conjunction with FIGS. 1A to 3A.

The electric current flowing between the source region S and the drain region D via the channel develops a sharp voltage drop in the depletion region d between the drain region D and the pinch-off point P under the floating gate electrode FG, and in the semiconductor region LDS having a resistance greater than that of the source region S, as indicated by the solid line $a_1$. Therefore, the electric field intensity becomes maximum near the drain region D and in the semiconductor region LDS as indicated by the fine line $b_l$.

In these two portions, hot holes and hot electrons are generated like the aforementioned case, and most of the hot holes are detected by the ammeter $A_2$ as the semiconductor substrate current IBB.

According to the experiments carried out by the inventors, the semiconductor substrate current IBB exhibits maximum values IBBmax$_1$ and IBBmax$_2$ at two points, i.e., at a portion having a low control gate voltage VG and at a portion having a high control gate voltage, as indicated by the solid line $c_1$. The maximum value IBBmax$_1$ generates in the depletion region at the end of the drain region like the maximum value IBBmax of the device of Fig. 1B, and the maximum value IBBmax$_2$ generates in the semiconductor region LDS on the side of the source region S.

As for the floating gate current IG, on the other hand, a large current (corresponding to IBBmax$_2$) is injected through the semiconductor region LDS on the side of the source region as indicated by the fine line d$_1$, the current being about 10$^{-9}$[A] which is greater by about several hundred of times than the maximum value IGmax of FIG. 3B.

That is, by providing the semiconductor region LDS between the source region S and the region where the channel will be formed, the injection efficiency can be improved as indicated by fine lines d$_l$, d$_2$. This is attributed to the fact that the difference between the control gate voltage VG and the potential in the semiconductor region LDS where hot electrons are generated, is greater than the difference between the control gate voltage VG and the potential near the drain region.

Next, concrete structure of the first embodiment will be described below.

Figure 4:
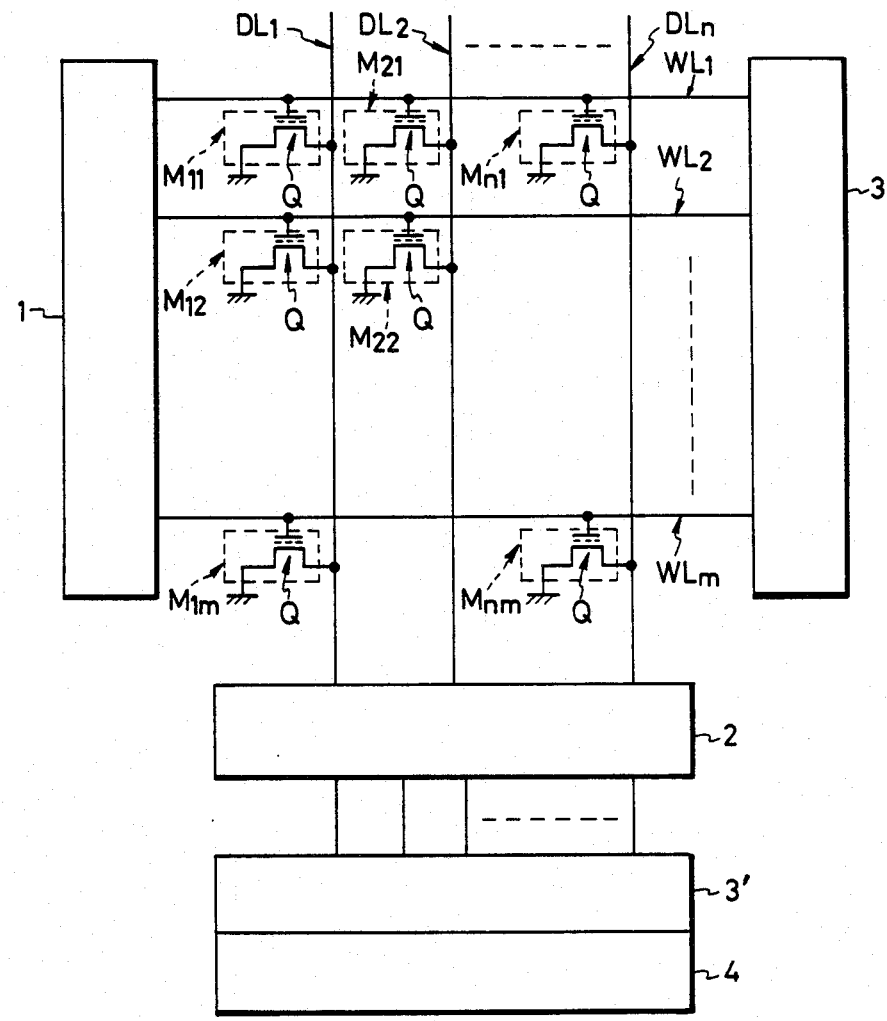
FIG. 4 is a diagram of an equivalent circuit of a memory cell array in the EPROM for explaining the outline of the first embodiment of the present invention.

FIG. 4 is a diagram of an equivalent circuit of a memory cell array in the EPROM for explaining the outline of the first embodiment of the present invention.

In FIG. 4, reference numeral 1 denotes an X decoder which selects a predetermined word line that will be mentioned later, and which renders turn on a predetermined memory cell that is connected to the word line.

Reference numeral 2 denotes a Y decoder which selects a predetermined data line that will be described later, and which applies to the data line a voltage that serves as data.

Reference numerals 3, 3' denote writing circuits which select a predetermined word line and a predetermined data line that will be mentioned later, and which write data onto a predetermined memory cell connected to the word line and to the data line.

Reference numeral 4 denotes a sense amplifier which reads data from a predetermined memory cell connected to the data line.

The X decoder 1, Y decoder 2, writing circuits 3, 3' and sense amplifier 4 constitute peripheral circuits of the EPROM.

Symbols WL$_l$, WL$_2$ ---, WLm denote word lines whose ends on one side are connected to the X decoder 1 and whose ends on the other side are connected to the writing circuit 3. The word lines WL stretch in the X-direction, and are provided in a plurality of number in the Y-direction. The word lines WL select memory cells connected thereto and write data thereon.

Symbols DL$_l$, DL$_2$ ---, DLn denote data lines whose ends on one side are connected to the Y decoder 2, to the writing circuit 3'and to the sense amplifier 4. The data lines DL stretch in the Y-direction and are provided in a plurality of number in the X-direction to transmit the data of memory cells connected thereto.

Symbols M$_{11}$, M$_{12}$, ---, M$_{nm}$ denote memory cells that are arrange in a plurality of number at intersecting points of word lines WL and data lines DL. Each memory cell M comprises a field-effect transistor Q which has a floating gate electrode and a control gate electrode connected to a predetermined word line WL, and of which one terminal is connected to a predetermined data line DL, and of which the other terminal is grounded.

The memory cells M are arranged in a plurality of number in matrix (in rows and columns) to constitute a memory cell array.

Concrete structure of the embodiment will be described below.

Figure 5:
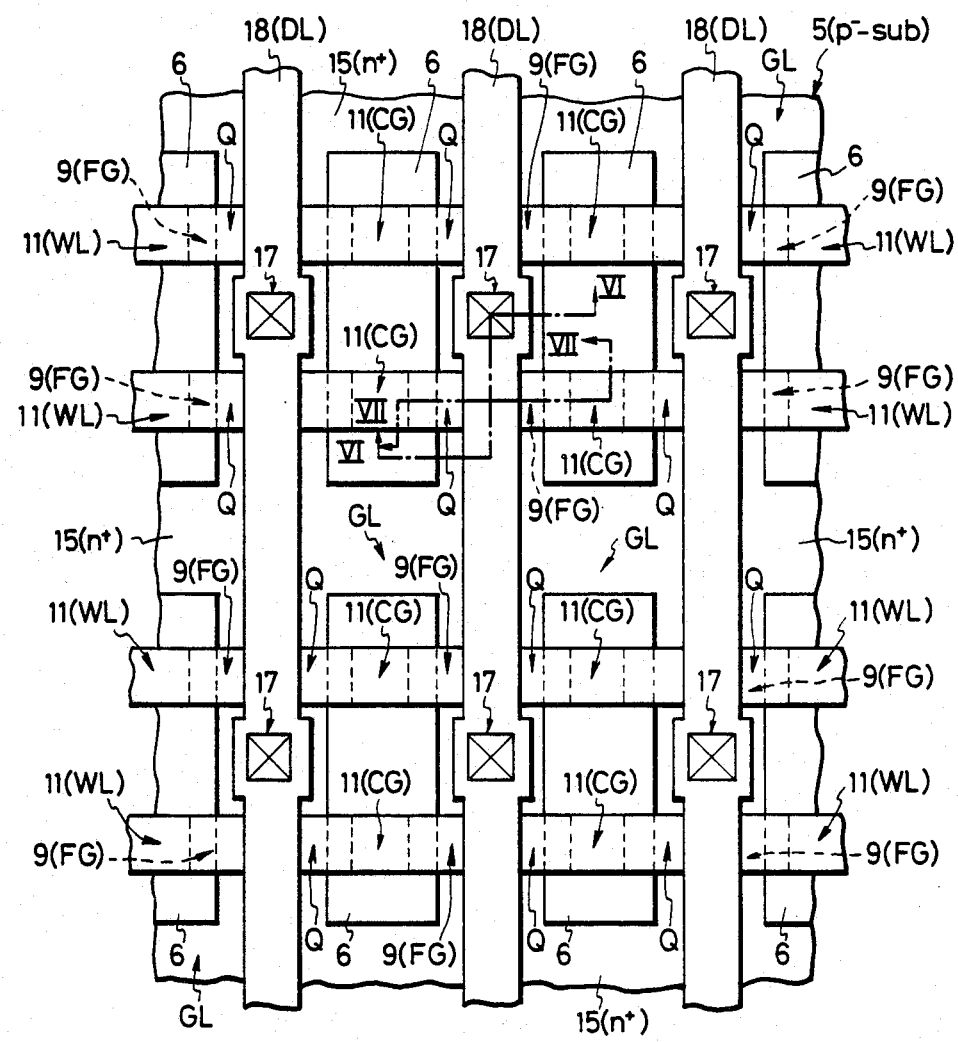
FIG. 5 is a plan view of a major portion of the memory cell array in the EPROM for explaining the first embodiment of the present invention.
Figure 6:
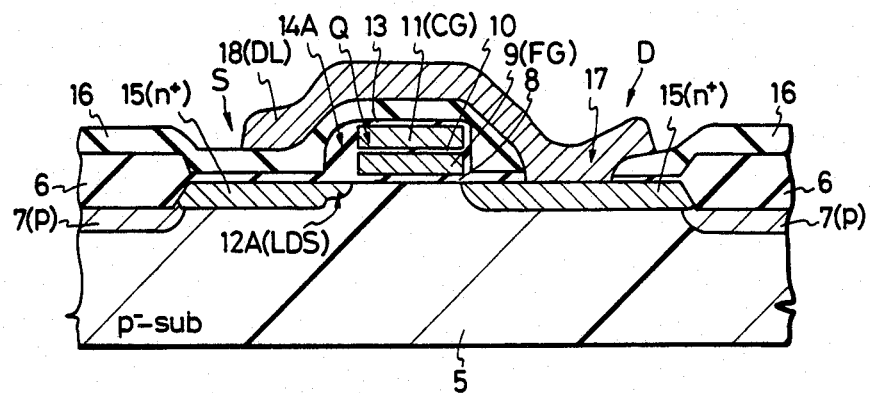
FIG. 6 is a section view along the line VI—VI of FIG. 5.
Figure 7:
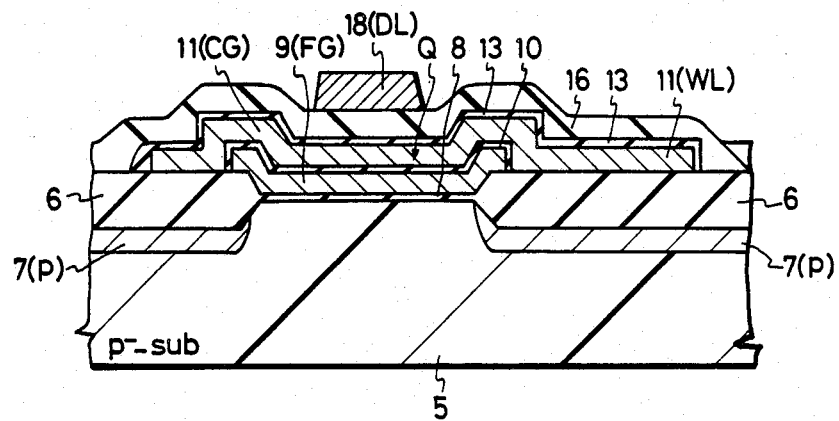
FIG. 7 is a section view along the line VII—VII of FIG. 5.

FIG. 5 is a plan view of a major portion of the memory cell array in the EPROM for explaining the first embodiment of the present invention, FIG. 6 is a section view along the line VI—VI of FIG. 5, and FIG. 7 is a section view along the line VII—VII of FIG. 5.

In FIGS. 5 to 7, reference numeral 5 denotes a p$^-$-type semiconductor substrate Sub which comprises of single crystalline silicon, and which constitutes an EPROM.

Reference numeral 6 denotes a field insulating film which made of a silicon oxide film, and which is formed on the main surface of the semiconductor substrate 5 among the regions where semiconductor elements will be formed. The field insulating film 6 works to electrically isolate the semiconductor elements from each other.

Reference numeral 7 denotes a p-type channel stopper region which is provided in the main surface of the semiconductor substrate 5 under the field insulating film 6. The channel stopper region 7 works to electrically isolate the semiconductor elements from each other.

Reference numeral 8 denotes an insulating film comprising a silicon oxide film which is provided on the main surface of the semiconductor substrate 5 of a region where the semiconductor element will be formed. The insulating film 8 works chiefly to constitute a gate insulating film of the field-effect transistor.

Reference numeral 9 denotes an electrically conductive layer comprising a polycrystalline silicon film which is provided on the insulating film 8. The electrically conductive layer 9 constitutes a floating gate electrode FG of a memory cell in the EPROM.

Reference numeral 10 denotes an insulating film comprising a silicon oxide film which is so provided as to cover the electrically conductive layer 9. The insulating film 10 works chiefly to electrically isolate the electrically conductive layer 9 from an electrically conductive layer that is provided thereon.

Reference numeral 11 denotes an electrically conductive layer comprising a polycrystalline film. There are provided a plurality of electrically conductive layers 11 in the Y-direction on a plurality of electrically conductive layers 9 that are arranged in the X-direction via insulating films 10. The electrically conductive layers 11 constitute control gate electrodes CG of memory cells of EPROM in the regions where the semiconductor elements will be formed, i.e., on the electrically conductive layers 9, and further constitute word lines WL of EPROM in other portions. The electrically conductive layers 11 may be composed of a refractory metal film such as of molybdenum, tungsten, tantalum or titanium, or a silicide film of such a refractory metal, or a multi-layer film formed by superposing a film of a refractory metal or a silicide thereof on a polycrystalline silicon film.

Reference numeral 12A denotes an n-type semiconductor region (LDS) which is electrically connected to the source region S and which is provided on one side of the electrically conductive layers 9, 11, i.e., which is provided in the main surface of the semiconductor substrate 5 between the source region S and a region where the channel will be formed. In the semiconductor region 12A, the voltage drops as the current flows between the source region S and the drain region D, and whereby hot electrons are generated and are injected as data into the electrically conductive layer (FG) 9.

The semiconductor region 12A has the same type of conductivity as the source region S and drain region D but has a concentration lower than that of these regions. Concretely speaking, the semiconductor region 12A is formed to have an impurity concentration of about $1\times10^{16}$ to $1\times10^{17}$ [atoms/cm$^3$] by implanting arsenic ions or phosphorus ions with the electrically conductive layers 9, 11 as masks. The semiconductor region 12A will have a length of about 0.3 to 0.4 [μm]. However, the impurity concentration and length of the semiconductor region 12A should in no way be limited to the above-mentioned values, but should be suitably selected by taking into consideration the electric field intensity for generating hot electrons, the intensity of current that flows between the source region S and the drain region D, and mutual conductance during the reading operation.

Reference numeral 13 denotes an insulating film comprising a silicon oxide film which is to provided as to cover the electrically conductive layers 9, 11.

Reference numeral 14A denotes an insulating film formed on the side walls of electrically conductive layers 9, 11 on the side of the source region S. The insulating film 14A forms the semiconductor region 12A. The insulating film 14A is formed after the semiconductor region 12A is formed. The insulating film 14A can be formed on the side walls of electrically conductive layers 9, 11 by the anisotropic etching such as reactive ion etching after the silicon oxide film has been formed by the chemical vapor deposition (CVD) method. Then, the insulating film 14A is removed from the side of the drain region by selective etching. The insulating film 14A may be removed during the step of manufacturing, and may not exist at the time when the EPROM is completed.

Reference numeral 15 denotes an n$^+$-type semiconductor region which is formed in the main surface of the semiconductor substrate 5 on the side of the insulating film 14A and on one side of the electrically conductive layers 9, 11. The semiconductor region 15 substantially works as a source region, a drain region or a ground (reference potential) line GL, and constitutes a field-effect transistor that works as a memory cell in the EPROM. The semiconductor region 15 that serves as the source region S is electrically connected to the semiconductor region 12A, as mentioned earlier.

The semiconductor region 15 is formed to have an impurity concentration of about $1\times10^{20}$ to $1\times10^{21}$ [atoms/cm$^3$] by implanting arsenic ions with the electrically conductive layers 9, 11 and insulating film 14A as masks. Accordingly, the semiconductor region 12A is left under the insulating film 14A on the side of the source region S. On the side of the drain region D, on the other hand, the semiconductor region 12A is contained in the semiconductor region 15, since the semiconductor region 15 has an impurity concentration which is extremely higher than that of the semiconductor region 12A. Like the aforementioned semiconductor region 12A, the impurity concentration of the semiconductor region 15 is suitably selected by taking a variety of conditions into consideration.

The memory cell M of EPROM, i.e., the fieldeffect transistor Q chiefly comprises the semiconductor substrate 5, electrically conductive layer 9 formed thereon via insulating film 8, electrically conductive layer 11 formed on the electrically conductive layer 9 via insulating film 10, a pair of semiconductor region 15, and a semiconductor region 12A formed between a region where the channel will be formed and the semiconductor region 15 that works as the source region S.

Reference numeral 16 denotes an insulating film comprising a phosphosilicate glass film which is so formed as to cover a semiconductor element such as field-effect transistor Q or the like. The insulating film 16 chiefly works to electrically isolate the electrically conductive layer 11 from the electrically conductive layer that is formed thereon.

Reference numeral 17 denotes a contact hole which is formed by removing the insulating films 8, 16 from a predetermined portion of the semiconductor region 15. The contact hole 17 works to electrically connect the semiconductor region 15 to the electrically conductive layer that is formed on the insulating film 16.

Reference numeral 18 denotes electrically conductive layers comprising aluminum that are electrically connected to predetermined semiconductor regions 15 via contact holes 17 and that are provided in a plurality of number in the X-direction stretching in the Y-direction to intersect the electrically conductive layers 11 on the insulating film 16. The electrically conductive layers 18 constitute data lines DL of the EPROM.

Next, writing operation and reading operation of the embodiment will be briefly described below in conjunction with FIGS. 4 to 7.

Writing operation is described below, first.

A data line (DL) 18 and a word line (WL) 11 connected to a memory cell M on which the data will be written are selected by the X decoder 1 and Y decoder 2. Voltages are then applied from the writing circuits 3, 3' to the data line (DL) 18 and word line (WL) 11 that are selected. A voltage of, for example, 5 volts is applied to the data line (DL) 18 that is selected, and zero volt is applied to the other data lines DL. Further, a voltage of, for example, 10 volts is applied to the word line (WL) 11 that is selected, and zero volt is applied to other word lines WL.

In the memory cell M which is selected, therefore, electrons are injected into the electrically conductive layer 9 that serves as the floating gate electrode FG from the semiconductor region 12A formed between the semiconductor region 15 that works as the source region S and a region where the channel will be formed. Therefore, a MISFET that constitutes a memory cell M acquires a high threshold voltage. Namely, data is written onto the memory cell.

Reading operation will be described next.

The data line (DL) 18 and the word line (WL) 11 connected to the memory cell M on which the data will be written are selected by the X decoder 1 and Y decoder 2. Voltages are then applied from the X decoder 1 and Y decoder 2 to the data line (DL) 18 and word line (WL) 11 that are selected. A voltage of, for example, 5 volts is applied to the data line (DL) 18 that is selected, and zero volt is applied to other data lines DL. Further, a voltage of, for example, 5 volts is applied to the word line (WL) 11 that is selected, and zero volt is applied to other word lines WL.

When the data is written onto the selected memory cell M, i.e., when a high threshold voltage is acquired, the voltage applied to the data line (DL) 18 is maintained. Therefore, the data "1" is read out by the sense amplifier 4. When no data is written onto the selected memory cell M, i.e., when the threshold voltage does not change, the data line (DL) 18 is grounded via the memory cell M and ground line GL, whereby the sense amplifier 4 reads out the data "0".

According to the first embodiment, the effects are obtained as described below.

(1) A semiconductor region is provided between the source region of a field-effect transistor and a region where the channel will be formed in the EPROM, the semiconductor region having the same type of conductivity as the source region but a lower impurity concentration than the source region. Therefore hot electrons are generated in a portion of a low potential and are injected into the floating gate electrode, causing the voltage difference to increase with respect to the control gate voltage and enabling the writing efficiency to increase.

(2) Owing to the fact mentioned in (1) above, the writing time can be reduced, and the operation speed of the EPROM can be increased.

(3) The writing efficiency is improved owing to the fact mentioned in (1) above. Therefore, the control gate voltage and the drain voltage can be reduced during the writing operation.

(4) A semiconductor region having the same type of conductivity as the drain region and a low impurity concentration is not provided between the drain region and the region where the channel will be formed in the field-effect transistor in the EPROM. Therefore, mutual conductance of a current flowing between the source region and the drain region can be increased, and the reading efficiency can be improved.

(5) Owing to the fact mentioned in (4) above, the reading time can be reduced, and the operation speed of the EPROM can be increased.

(6) Owing to the facts mentioned in (2) and (5) above, the writing time and the reading time can be reduced, making it possible to further increase the operation speed of the EPROM.

(7) A semiconductor region is provided between the source region and the region where the channel will be formed, the semiconductor region having a junction which is shallower than the source region. Therefore, the source region stretches little to the under side of the floating gate electrode, and the channel can be shortened.

(8) Owing to the fact mentioned in (7) above, the channel is shortened, and the degree of integration of EPROM can be increased.

Figure 8:
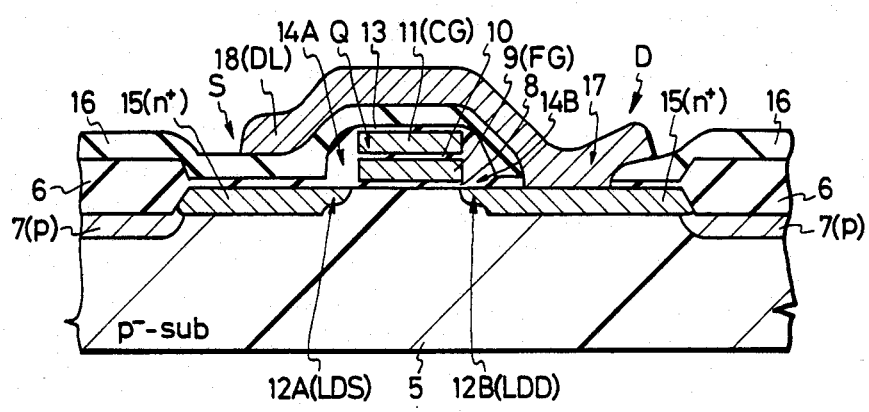
FIG. 8 and 9 are section views of a major portion of the memory cell in the EPROM for explaining a second embodiment of the present invention.
Figure 9:
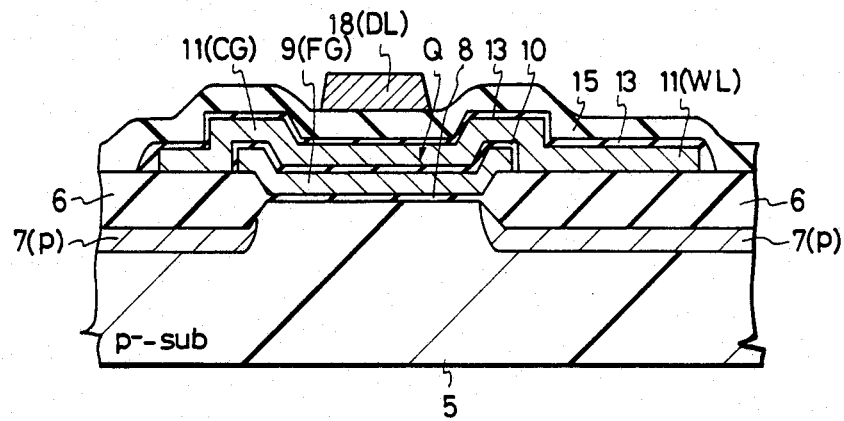
Figure 10:
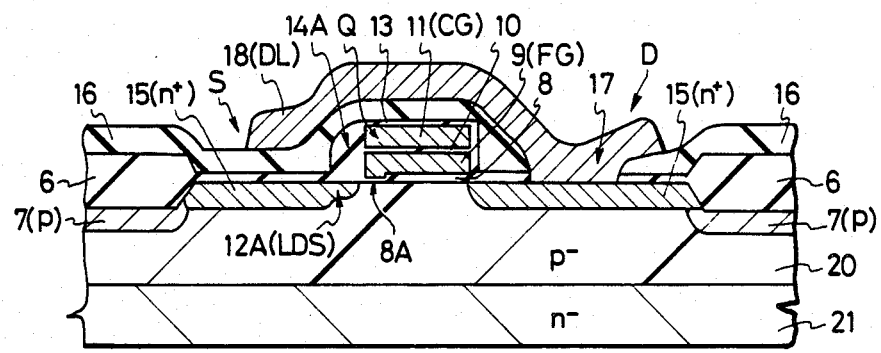
FIG. 10 is a section view showing a further embodiment according to the present invention.

FIGS. 8 and 9 are section views of a major portion of the memory cell in the EPROM for explaining a second embodiment of the present invention.

In FIGS. 8 and 9, reference numeral 12B denotes an n-type semiconductor region (LDD: lightly doped drain) which is electrically connected to the drain region D, and which is provided on one side of the electrically conductive layers 9, 11, i.e., which is provided in the main surface of the semiconductor substrate 5 between the drain region D and the region where the channel will be formed. The semiconductor region 12B has a junction shallower than the drain region D, so that the drain region D stretches little to the under side of the floating gate electrode FG, contributing to shorten the channel length.

Further, the semiconductor region 12B has a low impurity concentration and enables the junction breakdown voltage to increase relative to the semiconductor substrate 5.

Moreover, the semiconductor region 12B having a low impurity concentration permits little current to flow between the source region S and the drain region D. Therefore, hot electrons are not generated in the source region S during the reading operation, and erroneous writing operation is prevented from occurring.

In order not to increase the number of manufacturing steps, the semiconductor region 12B is formed in the same step as the formation of the semiconductor region 12A and to have the same impurity concentration. Namely, the semiconductor region 12B is formed using the insulating film 14B which is formed on the side wall of the electrically conductive layers 9, 11 on the drain side. The insulating film 14B forms the semiconductor region 12B.

By taking the writing efficiency, reading efficiency, junction withstand voltage and erroneous wiring into consideration, furthermore, the semiconductor region 12A and the semiconductor region 12B may be formed to have different impurity concentrations, though the number of manufacturing steps may increase.

According to the second embodiment, the effects are obtained as described below in addition to effects that are nearly the same as those of the aforementioned first embodiment.

(1) A semiconductor region is provided between the drain region and the region where the channel will be formed, the semiconductor region having a junction which is shallower than the drain region. Therefore, the drain region stretches little to the under side of the floating gate electrode, and the channel can be shortened.

(2) Owing to the fact mentioned in (1) above, the channel is shortened, and the degree of integration of EPROM can be increased.

(3) A semiconductor region is provided between the drain region and the region where the channel will be formed, the semiconductor region having an impurity concentration lower than that of the drain region. Therefore, the junction breakdown voltage can be increased with respect to the semiconductor substrate, and electrical reliability of the EPROM can be increased.

(4) A semiconductor region is provided between the drain region and the region where the channel will be formed, the semiconductor region haing an impurity concentration lower than that of the drain region. Therefore, little current is allowed to flow between the source region and the drain region, and hot electrons are not generated in the source region during the reading operation, and erroneous writing operation is prevented from occurring.

(5) Owing to the facts mentioned in (3) and (4) above, the junction breakdown voltage can be increased with respect to the semiconductor substrate, and erroneous writing operation can be prevented from occurring. Therefore, electrical reliability of the EPROM can be further increased.

According to the novel technique disclosed in this specification, effects are obtained as described below.

(1) A semiconductor region is provided between the source region of a field-effect transistor and a region where the channel will be formed in the EPROM, the semiconductor region having the same type of conductivity as the source region but a lower impurity concentration than the source region. Therefore, hot electrons are generated in a portion of a low potential and are injected into the floating gate electrode, causing the voltage difference to increase with respect to the control gate voltage and enabling the writing efficiency to increase.

(2) Owing to the fact mentioned in (1) above, the writing time can be reduced, and the operation speed of the EPROM can be increased.

(3) The writing efficiency is improved owing to the fact mentioned in (1) above. Therefore, the control gate voltage and the drain voltage can be reduced during the writing operation.

(4) A semiconductor region having the same type of conductivity as the drain region and a low impurity concentration is not provided between the drain region and the region where the channel will be formed in the field-effect transistor in the EPROM. Therefore, mutal conductance of a current flowing between the source region and the drain region can be increased, and the reading efficiency can be improved.

(5) Owing to the fact mentioned in (4) above, the reading time can be reduced, and the operation speed of the EPROM can be increased.

(6) Owing to the facts mentioned in (2) and (5) above, the writing time and the reading time can be reduced, making it possible to further increase the operation speed of the EPROM.

(7) A semiconductor region is provided between the source region and the region where the channel will be formed, the semiconductor region having a junction which is shallower than the source region. Therefore, the source region stretches a little to the under side of the floating gate electrode, and the channel can be shortened.

(8) A semiconductor region is provided between the drain region and the region where the channel will be formed, the semiconductor region having a junction which is shallower than the drain region. Therefore, the drain region stretches a little to the lower side of the floating gate electrode, and the channel can be reduced.

(9) Owing to the facts mentioned in (7) and (8) above, the channel is shortened, and the degree of integration of EPROM can be increased.

(10) A semiconductor region is provided between the drain region and the region where the channel will be formed, the semiconductor region having an impurity concentration lower than that of the drain region. Therefore, the junction breakdown voltage can be increased with respect to the semiconductor substrate, and electrical reliability of the EPROM can be increased.

(11) A semiconductor region is provided between the drain region and the region where the channel will be formed, the semiconductor region having an impurity concentration lower than that of the drain region. Therefore, little current is allowed to flow between the source region and the drain region, and hot electrons are not generated in the source region during the reading operation, and erroneous writing operation is prevented from occurring.

(12) Owing to the facts mentioned in (10) and (11) above, the junction withstand voltage can be increased with respect to the semiconductor substrate, and erroneous writing operation can be prevented from occurring. Therefore, electrical reliability of the EPROM can be further increased.

(13) Owing to the facts mentioned in (2) and (12) above, operation speed of the EPROM can be increased and electrical reliability thereof can be increased, too.

In the foregoing was concretely described the invention accomplished by the inventors by way of embodiments. The invention, however, should in no way be limited to the above-mentioned embodiments only but may be modified in a variety of after ways without departing from the spirit and scope of the invention.

The above-mentioned embodiments have dealt with the cases where the invention was adapted to the EPROM. The invention, however, may also be adapted to a semiconductor integrated circuit device (EEPROM) equipped with read-only memory function which enables the data to be electrically erased. Concretely speaking, an insulating film (oxide film) 8A for tunneling in which a portion of the gate insulating film of MISFET that serves as a memory cell has a very small thickness (for instance, 20 angstroms), is provided on the side of the source region S. That is, the oxide film 8A for tunneling is provided on a region adjacent to the LDS region 12A, or on the LDS region 12A, or on both of these regions, so that the data can be written onto the side of the source region. Here, reference numeral 20 denotes a $p^-$-type well region, and 21 denotes an $n^-$-type semiconductor substrate.

Further, the region 12A may not be shallower than the region 15 and may have the same junction depth as the region 15. The region 12A may be formed without forming the insulating film 14A. It is essential that the region 12A has such an impurity concentration that hot carriers are generated on the source side. Hot carriers generated on the source side may not be electrons but may be holes. Namely, the individual semiconductor regions may have opposite conductivity types.

We claim:

1. A semiconductor memory device comprising:
   a semiconductor substrate of a first type of conductivity;
   a gate electrode formed over said semiconductor substrate;
   two semiconductor regions of a second type of conductivity formed in said semiconductor substrate on both sides of said gate electrode, said two semiconductor regions serving as a source region and a drain region, respectively;
   means for applying voltages to said gate electrode and to said two semiconductor regions; and
   means for establishing a predetermined large potential difference in said source region with respect to said gate electrode so that carriers are injected into said gate electrode from said source region due to said large potential difference with respect to said gate electrode.

2. A semiconductor memory device according to claim 1, wherein said gate electrode comprises a first gate electrode and a second gate electrode formed over said first gate electrode, and wherein said carriers are injected into said first gate electrode, and a voltage is applied to said second gate electrode from said voltage-applying means.

3. A semiconductor memory device comprising:
   a semiconductor substrate of a first type of conductivity;
   a first gate electrode formed on a first insulating film on said semiconductor substrate;
   a second gate electrode formed on a second insulating film on said first gate electrode; and
   a source region and a drain region of a second type of conductivity, that are formed in said semiconductor substrate on both sides of said first and second gate electrodes, at least said source region being comprised of a first portion that is adjacent to said gate electrodes and that has a low impurity concentration, and a second portion that is remote from said gate electrodes and that has a high impurity concentration;

wherein carriers are injected into said first electrode from the first portion of said source region.

4. A semiconductor memory device according to claim 3, wherein the impurity concentration in said first portion ranges from $1 \times 10^{16}$ to $1 \times 10^{17}$ atoms/cm$^3$.

5. A semiconductor memory device according to claim 4, wherein the impurity concentration in said second portion ranges from $1 \times 10^{20}$ to $1 \times 10^{21}$ atoms/cm$^3$.

6. A semiconductor memory device according to claim 3, wherein said first and second types of conductivities are the p-type and the n-type, respectively.

7. A semiconductor memory device according to claim 3, wherein said first portion is formed in said source region only.

8. A semiconductor memory device according to claim 7, wherein said second portion of said source region has the same impurity concentration as that of said drain region.

9. A semiconductor memory device according to claim 3, further comprising an insulating film formed on at least one of the two side walls of said gate electrodes, wherein said first portion of said source region is formed using said gate electrodes as a mask, and said second portion of said source region is formed using said gate electrodes and the insulating film on the side wall as a mask.

10. A semiconductor memory device according to claim 9, wherein said first portion is shallower than said second portion.

11. A semiconductor memory device according to claim 9, wherein said first portion is formed in said source region only.

12. A semiconductor memory device according to claim 11, wherein the insulating film of said side wall is formed only on the source side of said gate electrodes.

13. A semiconductor memory device according to claim 3, wherein a portion of said first insulating film on the source side is thinner than the other thereof.

14. A semiconductor memory device according to claim 1, wherein said source region is not overlapped by any gate electrode.

15. A semiconductor memory device according to claim 3, wherein the first portion of said source region is not overlapped by any gate electrode.

16. A semiconductor memory device comprising:
a semiconductor substrate of a first type of conductivity;
word lines formed in rows over said semiconductor substrate;
data lines formed in columns over said semiconductor substrate;
memory cells provided at intersecting points of said word lines and said data lines, each of said memory cells being comprised of a floating gate electrode formed on said semiconductor substrate, a control gate electrode formed on said floating gate electrode, and a source region and a drain region of a second type of conductivity that are formed in said semiconductor substrate on both sides of the gate electrodes, said control gate electrode and said drain region being connected to said word line and said data line, respectively;
wherein at least said source region is comprised of a first portion that is adjacent to said gate electrodes and that has a low impurity concentration, and a second portion that is remote from said gate electrodes and that has a high impurity concentration, and wherein carriers are injected into said floating gate electrode from said first portion of said source region.

17. A semiconductor memory device according to claim 16, wherein said source region only has said first and second portions.

18. A semiconductor memory device according to claim 17, further comprising an insulating film formed on the side wall on the source side of said gate electrodes, wherein said first portion of said source region is formed using said gate electrodes as a mask, and said second portion of said source region is formed using said gate electrodes and the insulating film on the side wall as a mask.

19. A semiconductor memory device according to claim 16, wherein the first portion of said source region is not overlapped by any gate electrode.

* * * * *